United States Patent
Hara (10) Patent No.: US 8,018,014 B2
(45) Date of Patent: Sep. 13, 2011

(54) SEMICONDUCTOR DEVICE

(75) Inventor: Kousuke Hara, Tokyo (JP)

(73) Assignee: OKI Semiconductor Co., Ltd., Tokyo (JP)

( * ) Notice: Subject to any disclaimer, the term of this patent is extended or adjusted under 35 U.S.C. 154(b) by 181 days.

(21) Appl. No.: 12/155,054

(22) Filed: May 29, 2008

(65) Prior Publication Data
US 2009/0294889 A1  Dec. 3, 2009

(51) Int. Cl.
H01L 27/14 (2006.01)
(52) U.S. Cl. ........ 257/435; 257/431; 257/432; 257/433; 257/434; 257/E31.001; 257/E31.121; 257/E31.122
(58) Field of Classification Search .......... 257/431–435, 257/E31.001, 121–122
See application file for complete search history.

(56) References Cited

U.S. PATENT DOCUMENTS
2006/0199295 A1*  9/2006  Hong et al. .................... 438/48
2007/0254400 A1*  11/2007 Yamada et al. ................ 438/64

FOREIGN PATENT DOCUMENTS
JP  2002-246576  8/2002

OTHER PUBLICATIONS

Hass, Optical Constants and Reflectance and Transmittance of Evaporated Aluminum in the Visible and Ultraviolet, J. Opt. Soc. Amer. 51, 1961, pp. 719-722.*

* cited by examiner

*Primary Examiner* — Kiesha R Bryant
*Assistant Examiner* — Minchul Yang
(74) *Attorney, Agent, or Firm* — Rabin & Berdo, PC

(57) ABSTRACT

A semiconductor device according to the present invention includes a semiconductor substrate: a photodiode responsive to a light, which is formed in the semiconductor substrate; at least an interlayer insulating layer formed over the semiconductor substrate, the at least an interlayer insulating layer comprising an upper most insulating layer; at least a conductive wiring layer, comprising an upper most conductive wiring layer formed on the upper most insulating layer; and a first passivation layer formed over the upper-most conductive wiring layer. The upper-most wiring layer is not formed directly above the photodiode. The first passivation layer is made of a permeability-resist material and is not formed directly above the photodiode.

14 Claims, 10 Drawing Sheets

SEMICONDUCTOR DEVICE

TECHNICAL FIELD OF THE INVENTION

The present invention generally relates to a semiconductor device, and more particularly to a semiconductor device including a light sensor (photodiode) and to a method for fabricating the same.

BACKGROUND OF THE INVENTION

Conventionally, a passivation layer is formed over a semiconductor device to protect the semiconductor device from deterioration, physical damage and the like. Usually, such a passivation layer is made of silicon nitride and is formed by a plasma CVD process. A silicon nitride is a permeability-resist material, through which an ultraviolet light hardly passes. Therefore, a passivation layer of a silicon nitride is difficult to use for a semiconductor device including a photodiode, which operates in response to a light supplied from an external device.

On the other hand, if a passivation layer having a high permeability is formed over the semiconductor device, a light may be entered into the semiconductor device from undesired angles. For example, an ultraviolet light may be entered from a direction that is inclined from a vertical direction to a sensing area of the photodiode. As a result, the sensitivity of the photodiode may be decreased.

For reference, a semiconductor device in the same technical field as the present invention is disclosed in Japan Patent Publication No. 2002-246576A. The semiconductor device includes a photodiode (12), conductive wiring layers, interlayer insulating layers, and a passivation layer (17). A feature of this invention is that the upper-most conductive wiring is re-arranged to make a wide-opened area above the photodiode. According to such a feature, the sensitivity of a photodiode could be improved. However, an inclined light may still be entered into the photodiode.

OBJECTS OF THE INVENTION

It is an object of the present invention is to provide a semiconductor device in which the sensitivity of a photodiode can be improved by controlling an entrance direction of input light to the photodiode.

Additional objects, advantages and novel features of the present invention will be set forth in part in the description that follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

According to a first aspect of the present invention, a semiconductor device includes a semiconductor substrate: a photodiode responsive to a light, which is formed in the semiconductor substrate; at least an interlayer insulating layer formed over the semiconductor substrate, the at least an interlayer insulating layer comprising an upper most insulating layer; at least a conductive wiring layer, comprising an upper most conductive wiring layer formed on the upper most insulating layer; and a first passivation layer formed over the upper-most conductive wiring layer. The upper-most wiring layer is not formed directly above the photodiode. The first passivation layer is made of a permeability-resist material and is not formed directly above the photodiode.

According to a second aspect of the present invention, a method for fabricating a semiconductor device includes the steps of: providing a semiconductor substrate; forming a photodiode in the semiconductor substrate; forming an upper-most interlayer insulating layer over the semiconductor substrate; forming an upper-most wiring layer on the upper-most interlayer insulating layer except on a region located directly above the photodiode; and forming a first passivation layer, which is made of a permeability-resist material, over the semiconductor substrate; removing a part of the first passivation layer located directly above the photodiode.

DETAILED DISCLOSURE OF THE INVENTION

In the following detailed description of the preferred embodiments, reference is made to the accompanying drawings which form a part hereof, and in which is shown by way of illustration specific preferred embodiments in which the inventions may be practiced. These preferred embodiments are described in sufficient detail to enable those skilled in the art to practice the invention, and it is to be understood that other preferred embodiments may be utilized and that logical, mechanical and electrical changes may be made without departing from the spirit and scope of the present inventions. The following detailed description is, therefore, not to be taken in a limiting sense, and scope of the present inventions is defined only by the appended claims.

Figure 1A:
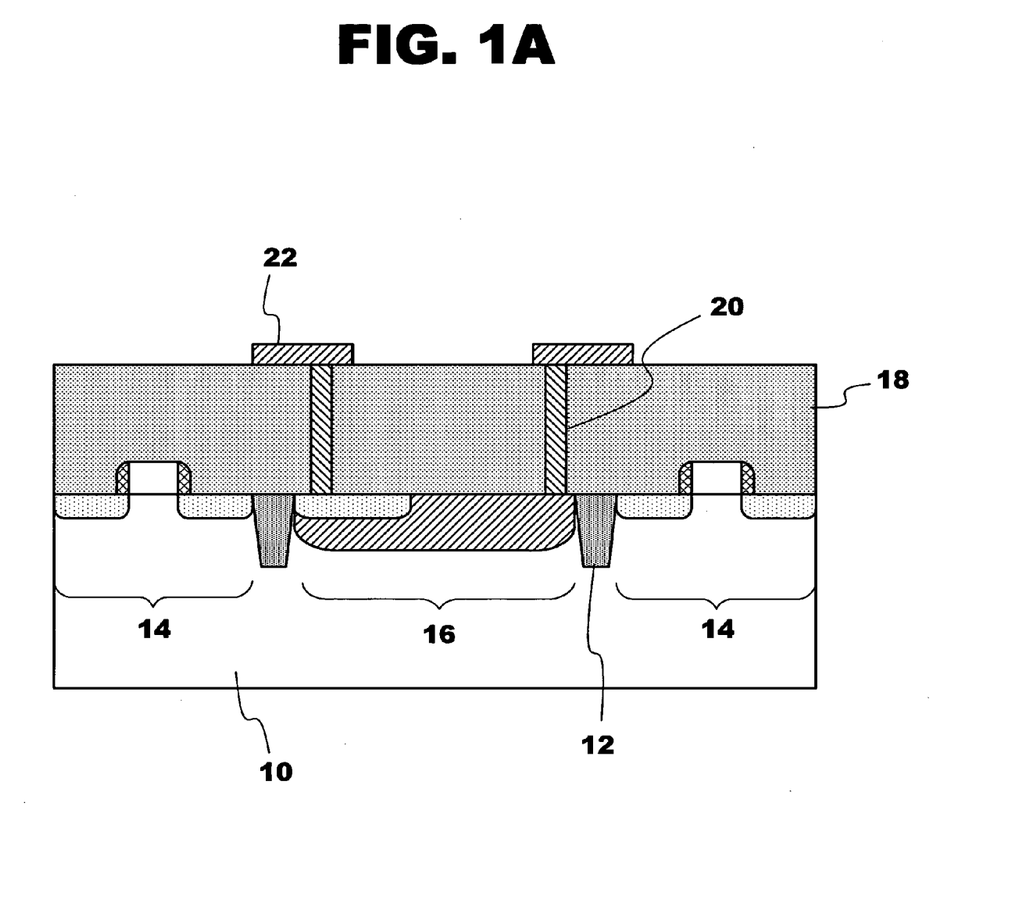
FIGS. 1A to 1D are cross-sectional views illustrating the fabrication steps of a first preferred embodiment of the present invention.

FIGS. 1A to 1D show the fabrication steps of a first preferred embodiment of the present invention. First, as shown in FIG. 1A, a photodiode region 16 and peripheral device regions 14 are formed in a semiconductor substrate (layer) 10. The peripheral device regions 14 each includes a gate electrode 15 formed on the semiconductor substrate 10. The photodiode region 16 and the peripheral device regions 14 are isolated by device isolating regions (STI) 12. The photodiode 16 may be an ultraviolet light sensor, an infrared light sensor or the like. Those elements 12, 14 and 16 are formed by conventional processes.

An interlayer insulating layer 18 is formed over the semiconductor substrate 10 by, for example, a plasma CVD process, so as to cover the gate electrode 15 and the photodiode region 16. The interlayer insulating layer 18 may be made of a silicon dioxide. The interlayer insulating layer 18 is flattened by a CMP process to have an appropriate thickness. A conductive wiring layer (pattern) 22 is formed on the interlayer insulating layer 18. The conductive wiring layer 22 may be of a laminated layer of TiN and Al. Contact plugs 20 are formed in the interlayer insulating layer 18.

Figure 1B:
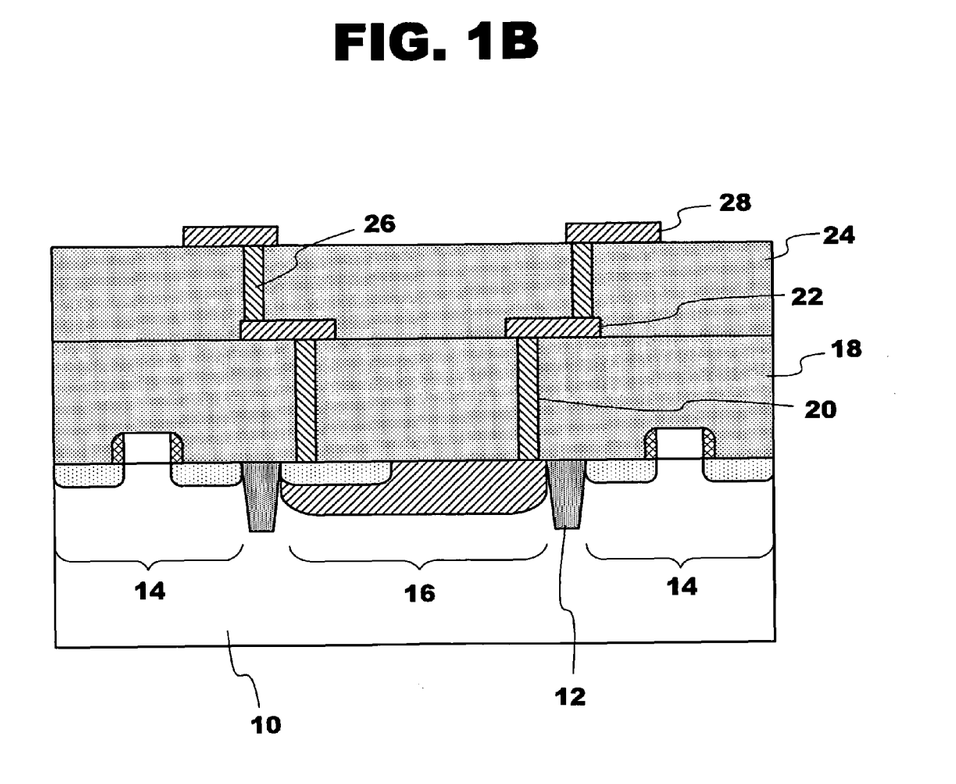

Next, as shown in FIG. 1B, another interlayer insulating layer 24 is formed over the conductive wiring layer 22. The interlayer insulating layer 24 may be of a NSG (Non-doped Silicate Glass) layer, which may be formed by a plasma CVD process using a TEOS gas. The interlayer insulating layer 24 is flattened by a CMP process to have an appropriate thickness, which is preferably at least 500 nm. The interlayer insulating layer 24 is to be used as an etching stop layer for terminating etching of a passivation layer 30 in the following process.

Subsequently, contact holes 26 are formed in the interlayer insulating layer 24, and are filled up with a metal, such as tungsten. Next, another conductive wiring layer (pattern) 28 is formed on the interlayer insulating layer 24 by a sputtering process. The conductive wiring layer (pattern) 28 is electrically connected via the contact holes 26 to the conductive wiring layer 22. The conductive wiring layer 28 may be of a laminated layer of TiN and Al. The conductive wiring layer 28 is shaped by photolithography process and dry etching process to be a predetermined pattern. The conductive wiring layer (upper most conductive layer) 28 is arranged not to be located directly above the photodiode 16.

Figure 1C:
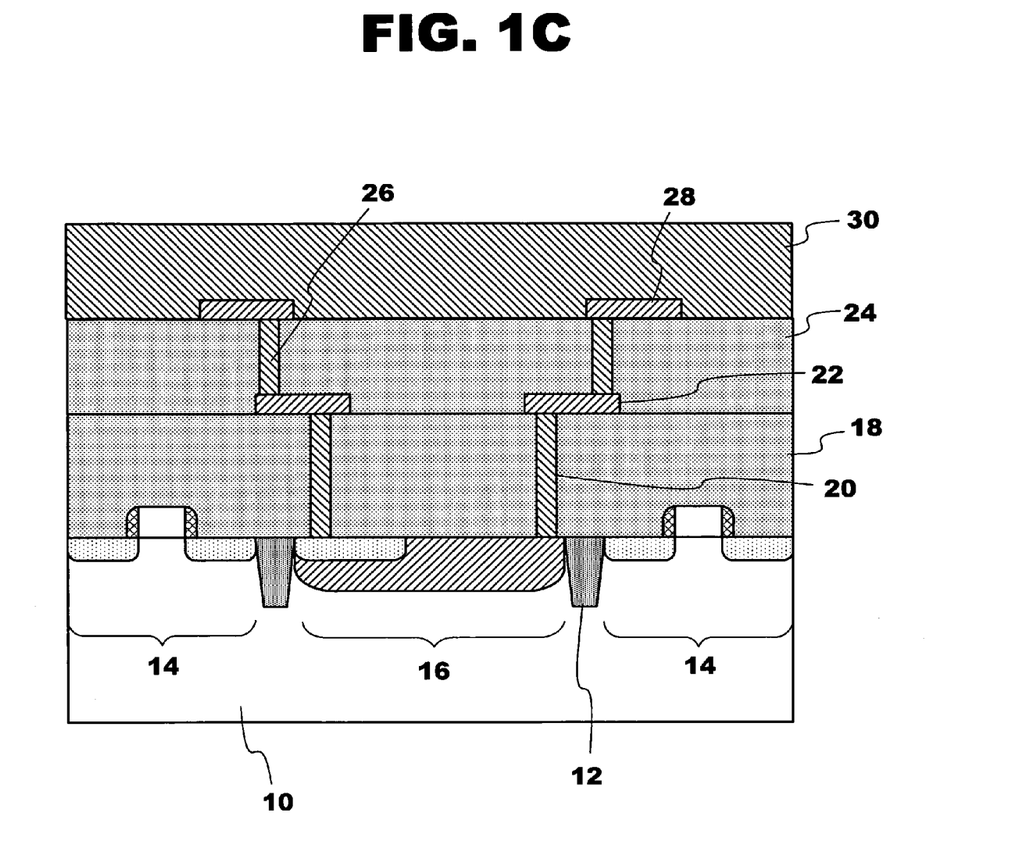

Next, as shown in FIG. 1C, a passivation layer 30 is formed over the semiconductor substrate entirely to have a thickness of less than 1000 nm, preferably 700-1000 nm. The passivation layer 30 is of a permeability-resist material having a transmissivity (light transmittance) of less than 30% to an input light. The passivation layer 30 may be of a nitride layer.

Figure 1D:
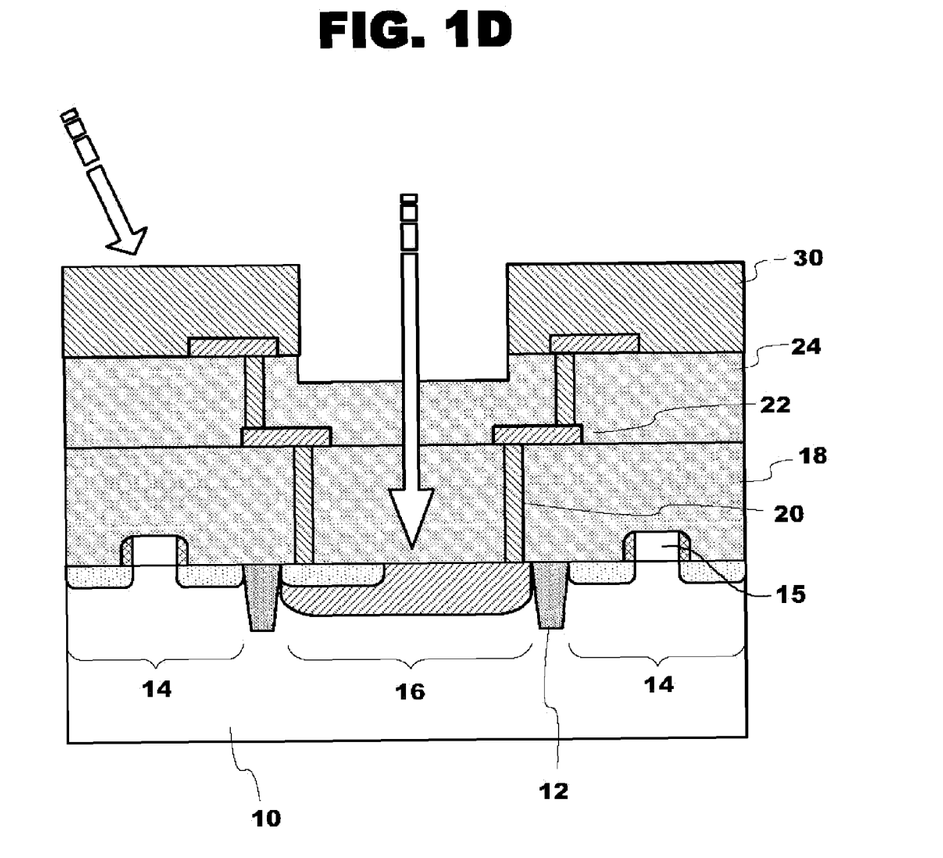

Subsequently, as shown in FIG. 1D, the passivation layer 30 is removed from a part located directly above the photodiode 16 by photolithography process and dry etching process. This etching process is performed to removed the passivation layer 30 from the part located directly above the photodiode 16 and is terminated before the conductive wiring pattern 22 is exposed.

In the present invention, it is important that the upper most wiring layer 28 is not located directly above the photodiode 16, and any of the wiring layers 22 and 28 is not exposed. If the wiring layer 22 or 28 is exposed, erosion would occur to the metal, small pieces of etched metal would remain and cause operational errors of the photodiode 16.

According to the first preferred embodiment of the present invention, an input light is entered only in a vertical direction to the photodiode 16. In other words, it can be prevented that an oblique light is entered to the photodiode 16 from inclined directions. As a result, the sensitivity of the photodiode 16 can be improved. Further, the passivation layer 30 functions properly as a protection layer to protect the semiconductor device from moisture, contamination, physical damage and electrical deterioration.

Figure 2A:
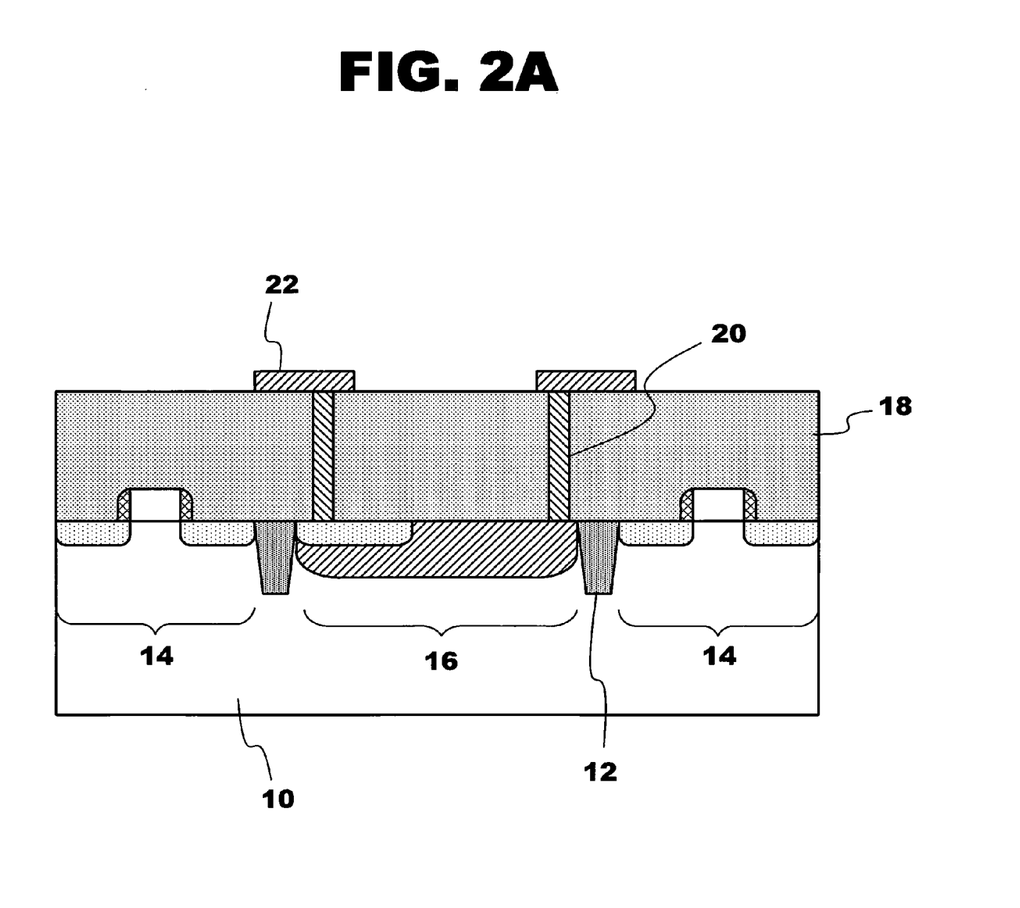
FIGS. 2A to 2F are cross-sectional views illustrating the fabrication steps of a second preferred embodiment of the present invention.

FIGS. 2A to 2F are cross-sectional views illustrating the fabrication steps of a second preferred embodiment of the present invention. First, as shown in FIG. 2A, a photodiode region 16 and peripheral device regions 14 are formed in a semiconductor substrate (layer) 10. The photodiode region 16 and the peripheral device regions 14 are isolated by device isolating regions (STI) 12. The photodiode 16 may be an ultraviolet light sensor, an infrared light sensor or the like. Those elements 12, 14 and 16 are formed by conventional processes.

An interlayer insulating layer 18 is formed over the semiconductor substrate 10 by, for example, a plasma CVD process. The interlayer insulating layer 18 may be made of a silicon dioxide. The interlayer insulating layer 18 is flattened by a CMP process to have an appropriate thickness. A conductive wiring layer (pattern) 22 is formed on the interlayer insulating layer 18. The conductive wiring layer 22 may be of a laminated layer of TiN and Al. Contact plugs 20 are formed in the interlayer insulating layer 18.

Figure 2B:
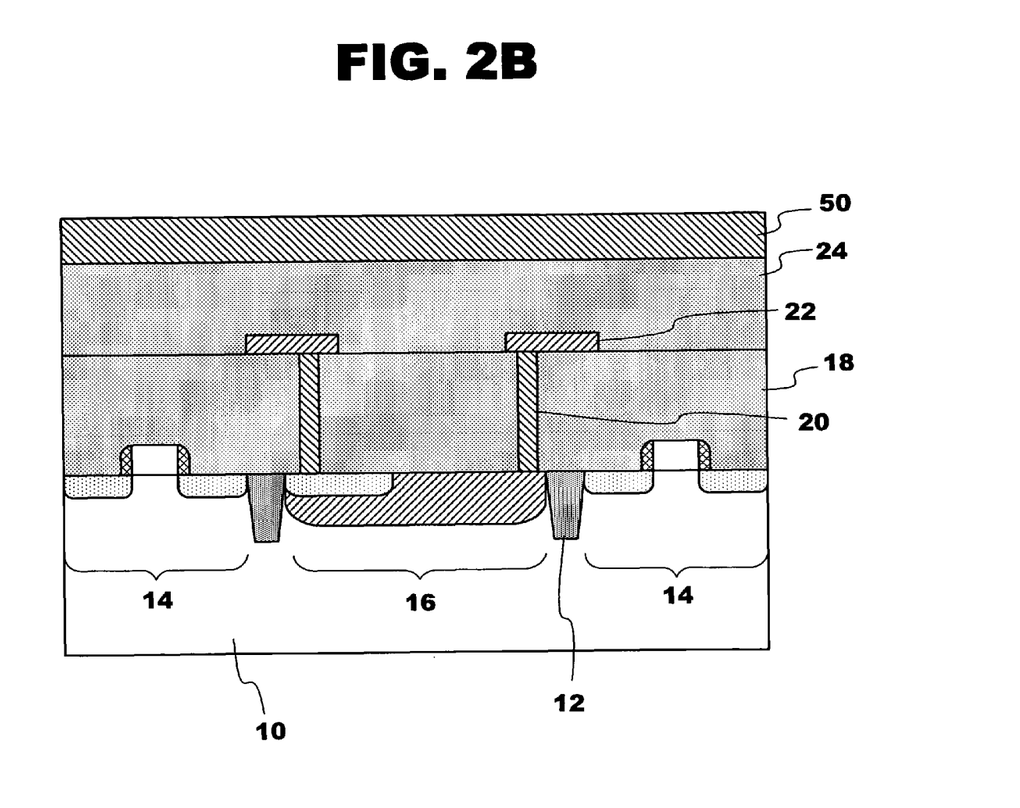

Next, as shown in FIG. 2B, another interlayer insulating layer 24 is formed over the conductive wiring layer 22. The interlayer insulating layer 24 may be of a NSG (Non-doped Silicate Glass) layer, which may be formed by a plasma CVD process using a TEOS gas. The interlayer insulating layer 24 is flattened by a CMP process to have an appropriate thickness.

Subsequently, a passivation layer 50 having a high permeability is formed over the semiconductor substrate entirely to have a thickness of 100 nm to 600 nm, preferably 300 nm. The passivation layer 50 is made of silicon nitride and may be formed by a conventional process. The thickness of the passivation layer 50 is determined so that the passivation layer 50 functions as a passivation (protection) film sufficiently and not to be supplied with a large amount of stress thereon. Preferably, the passivation layer 50 has a transmissivity (light transmittance) of higher than 50%.

Figure 2C:
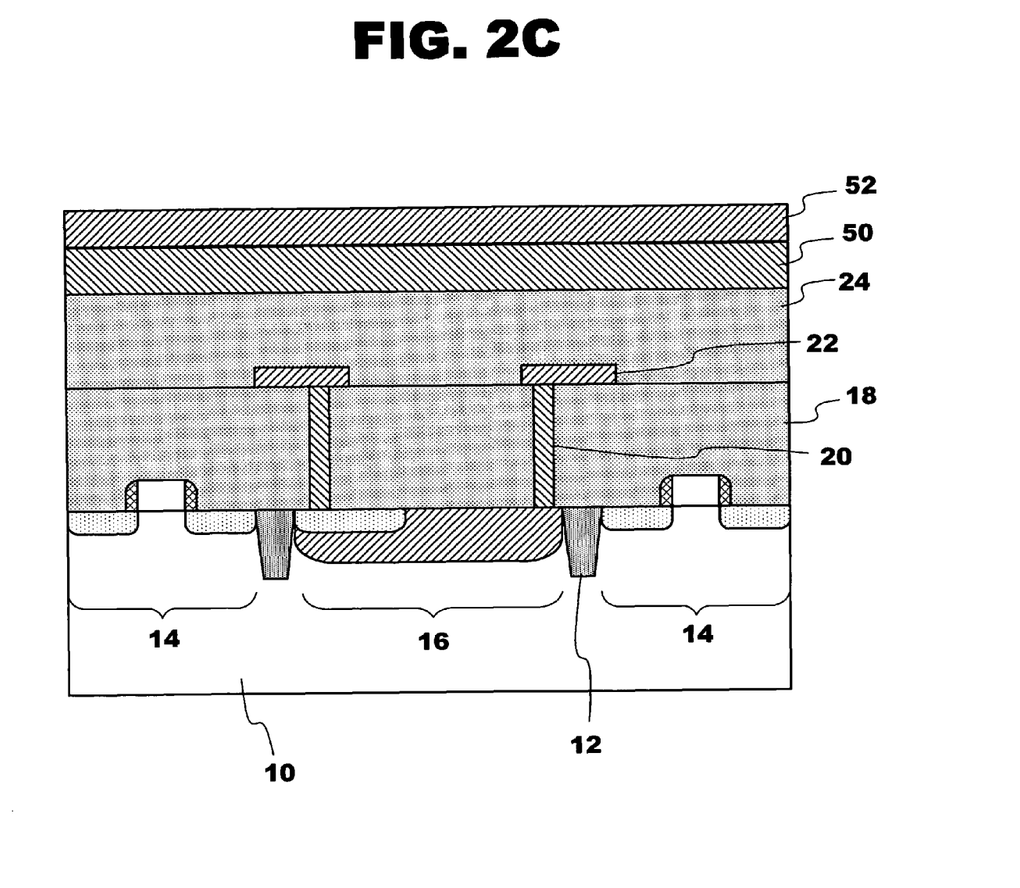

Next, as shown in FIG. 2C, a NSG layer 52 is formed on the passivation layer 50 to provide better bonding characteristic of a metal layer (56). The NSG layer 52 is formed to have a thickness of 100 nm to 500 nm, preferably, 200 nm. The thickness of the NSG layer 52 is determined so that contact holes 54 can be formed properly.

Figure 2D:
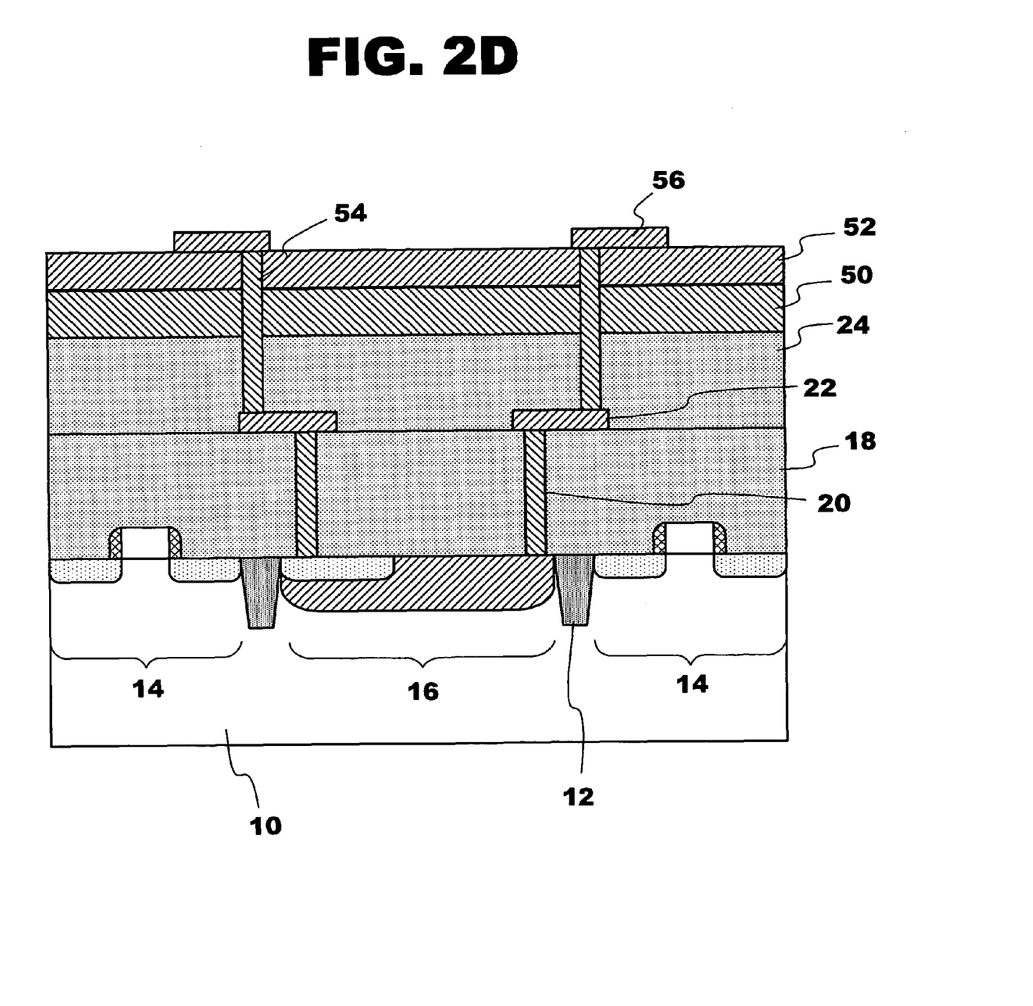

Next, as shown in FIG. 2D, contact holes 54 are formed through the NSG layer 24, the passivation layer 50 and the NSG layer 52 by photolithography process and dry etching process. The contact holes 54 are filled up with metal, such as tungsten. After that, a conductive wiring pattern 56 is formed by sputtering process, photolithography process and dry etching process, so that the conductive wiring pattern 56 is electrically connected through the contact holes 54 to the lower wiring pattern 22. The wiring pattern 56 may be of a laminated layer of TiN and Al. The conductive wiring layer (upper most conductive layer) 56 is arranged not to be located directly above the photodiode 16.

Figure 2E:
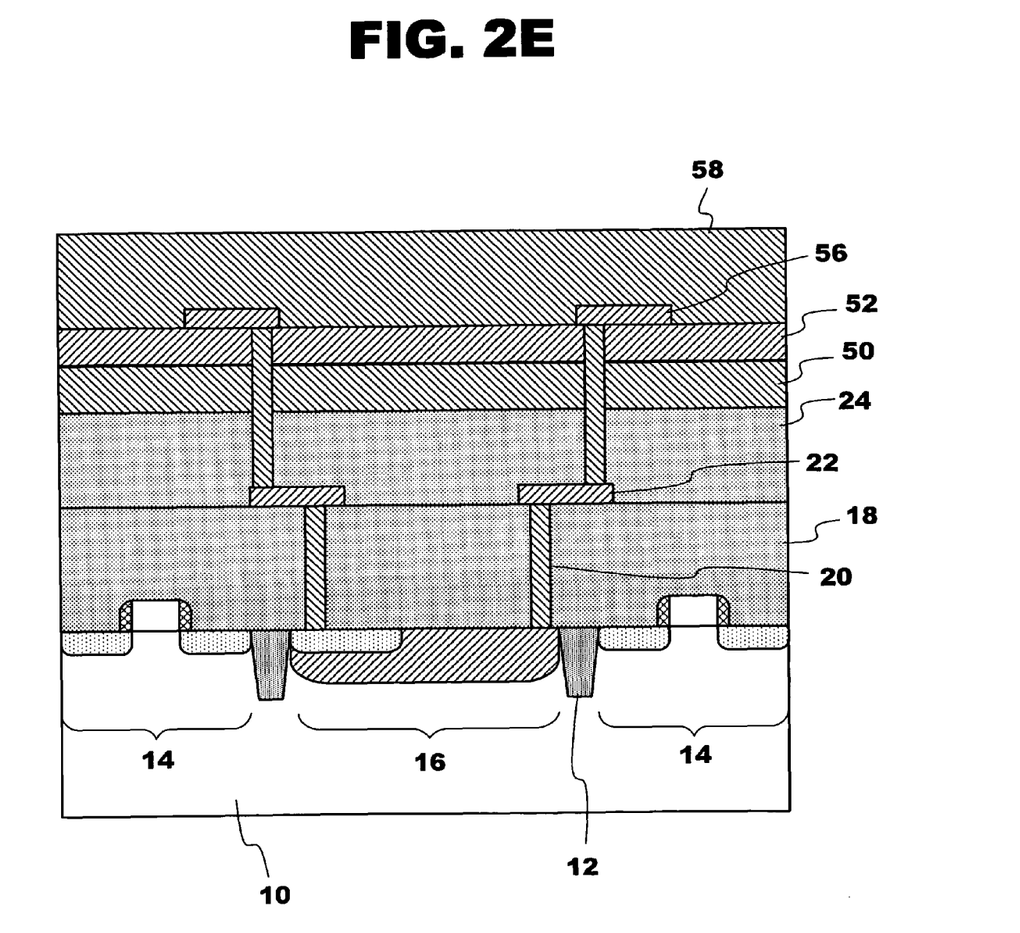

Next, as shown in FIG. 2E, a passivation layer 58 is formed over the semiconductor substrate entirely to have a thickness of less than 1000 nm, preferably 700-1000 nm. The passivation layer 58 is of a permeability-resist material having a transmissivity of less than 30% to an input light. The passivation layer 58 may be of a nitride layer.

Figure 2F:
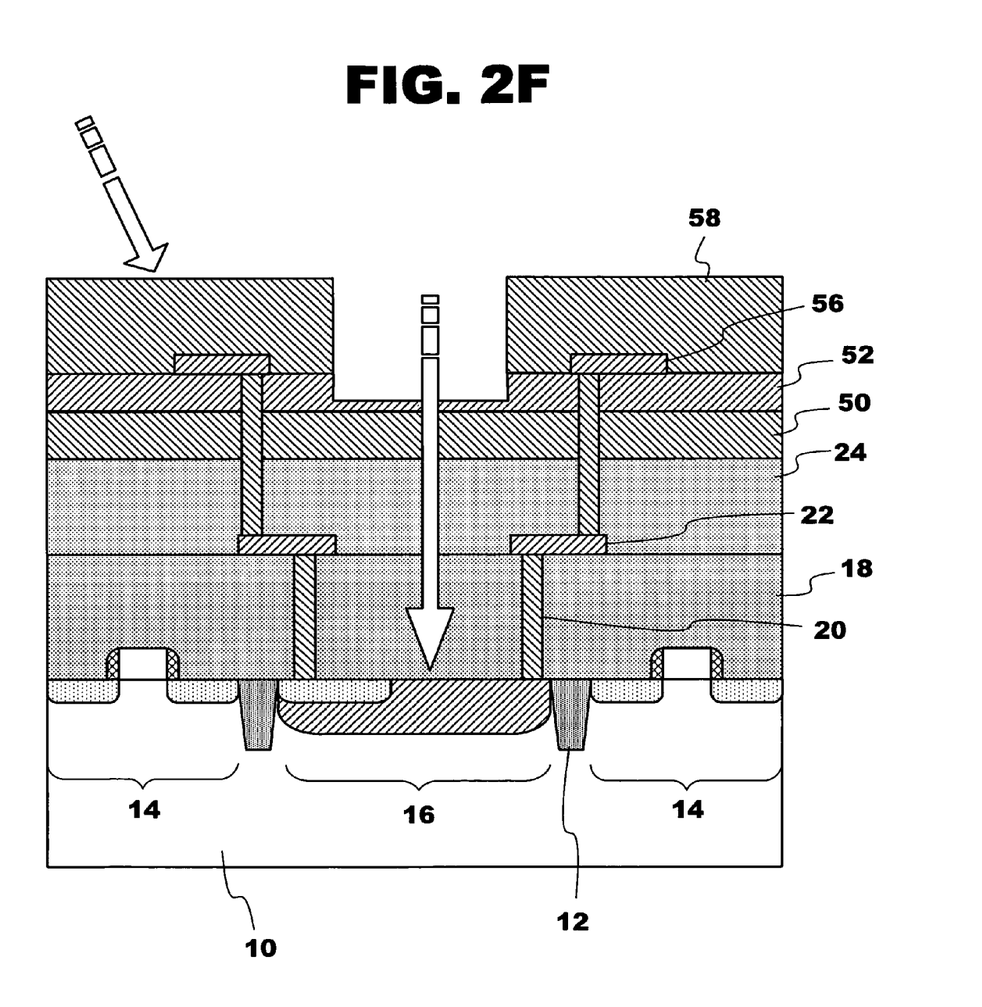

Subsequently, as shown in FIG. 2F, the passivation layer 58 is removed from a part located directly above the photodiode 16 by photolithography process and dry etching process. This etching process is performed to removed the passivation layer 58 from the part located directly above the photodiode 16. In the etching process, the NSG layer 52 functions as an etching stopper for terminating etching of the passivation layer 58. The passivation layer 50 may be exposed when the passivation layer 58 is etched.

In the present invention, it is important that the upper most wiring layer 56 is not located directly above the photodiode 16, and any of the wiring layers 22 and 56 is not exposed. If the wiring layer 22 or 56 is exposed, erode would occur to the metal, small pieces of etched metal would remain and cause operational errors of the photodiode 16.

According to the second preferred embodiment of the present invention, an input light is entered only in a vertical direction to the photodiode 16. In other words, it can be prevented that an oblique light is entered to the photodiode 16 from inclined directions. As a result, the sensitivity of the photodiode 16 can be improved. Further, the passivation layer 58 functions properly as a protection layer to protect the semiconductor device from moisture, contamination, physical damage and electrical deterioration.

In addition to the advantages of the first preferred embodiment, according to the second preferred embodiment, the photodiode 16 is more reliably protected by both of the two passivation layers 50 and 58.

What is claimed is:

1. A semiconductor device, comprising:
   a semiconductor substrate having a gate electrode formed thereon;
   a photodiode responsive to an input light, which is formed in the semiconductor substrate;
   at least an interlayer insulating layer formed over the semiconductor substrate, the at least an interlayer insulating layer comprising a non-doped silicate glass (NSG), upper most insulating layer that covers the photodiode, and a lower most insulating layer having the NSG upper most insulating layer disposed thereon, the lower most insulating layer covering a surface of the photodiode and covering the gate electrode, the lower most insulating layer being comprised of a different material than the upper most insulating layer;
   at least a conductive wiring layer including an intermediate conductive wiring layer surrounded and completely covered by the NSG upper most insulating layer, and further comprising an upper most conductive wiring layer formed on the NSG upper most insulating layer; and
   a first passivation layer, comprised of nitride, formed over to cover the upper-most conductive wiring layer, wherein
   the upper-most wiring layer is not formed directly above the photodiode,
   the first passivation layer is made of a permeability-resist material and is not formed directly above the photodiode so that the photodiode is exposed from the first passivation layer.

2. A semiconductor device according to claim 1, wherein the upper-most insulating layer comprises an exposed region located above the photodiode.

3. A semiconductor device according to claim 1, wherein the first passivation layer has a transmissivity (light transmittance) of less than 30%.

4. A semiconductor device according to claim 1, wherein the photodiode is a sensor of an ultraviolet light, and the first passivation layer has a characteristic of permeability-resist to an ultraviolet light.

5. A semiconductor device according to claim 1, wherein the photodiode is a sensor of an infrared light, and the first passivation layer has a characteristic of permeability-resist to an infrared light.

6. A semiconductor device according to claim 1, wherein the first passivation layer has a thickness of less than 1000 nm.

7. A semiconductor device according to claim 1, further comprising:
   a second passivation layer formed under the upper-most insulating layer, the second passivation layer having a high permeability.

8. A semiconductor device according to claim 7, wherein the second passivation layer has a transmissivity (light transmittance) of higher than 50%.

9. A semiconductor device according to claim 7, wherein the upper-most insulating layer comprises an exposed region located above the photodiode.

10. A semiconductor device according to claim 7, wherein the first passivation layer has a transmissivity (light transmittance) of less than 30%.

11. A semiconductor device according to claim 7, wherein the photodiode is a sensor of an ultraviolet light, and the first passivation layer has a characteristic of permeability-resist to an ultraviolet light.

12. A semiconductor device according to claim 7, wherein the photodiode is a sensor of an infrared light, and the first passivation layer has a characteristic of permeability-resist to an infrared light.

13. A semiconductor device according to claim 7, wherein the first passivation layer has a thickness of less than 1000 nm.

14. A semiconductor device according to claim 1, wherein the lower most interlayer insulating layer is comprised of silicon dioxide.

* * * * *